United States Patent
Bih et al.

(10) Patent No.: US 9,803,274 B2
(45) Date of Patent: Oct. 31, 2017

(54) PROCESS KIT OF PHYSICAL VAPOR DEPOSITION CHAMBER AND FABRICATING METHOD THEREOF

(71) Applicant: TAIWAN SEMICONDUCTOR MANUFACTURING CO., LTD., Hsinchu (TW)

(72) Inventors: Shih-Wei Bih, Taichung (TW); Wei-Jen Chen, Taichung (TW); Yen-Yu Chen, Taichung (TW); Hsien-Chieh Hsiao, Taichung (TW); Chang-Sheng Lee, Shin-Chu (TW); Wei-Chen Liao, Nantou County (TW); Wei Zhang, Chupei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 125 days.

(21) Appl. No.: 14/080,561

(22) Filed: Nov. 14, 2013

(65) Prior Publication Data

US 2015/0129414 A1    May 14, 2015

(51) Int. Cl.
| | | |
|---|---|---|
| C23C 14/35 | (2006.01) |
| C23C 14/34 | (2006.01) |
| H01J 37/34 | (2006.01) |
| H01J 37/32 | (2006.01) |
| C23C 14/56 | (2006.01) |

(52) U.S. Cl.
CPC ............ *C23C 14/34* (2013.01); *C23C 14/564* (2013.01); *H01J 37/32467* (2013.01); *H01J 37/32477* (2013.01); *H01J 37/34* (2013.01); *H01J 37/3411* (2013.01); *H01J 37/3426* (2013.01); *H01J 37/3447* (2013.01)

(58) Field of Classification Search
CPC ............... H01J 37/3411; H01J 37/3426; H01J 37/3447; H01J 37/32477
See application file for complete search history.

(56) References Cited

U.S. PATENT DOCUMENTS

| | | | | |
|---|---|---|---|---|
| 5,202,008 A | * | 4/1993 | Talieh et al. ............. | 204/192.32 |
| 6,149,784 A | * | 11/2000 | Su et al. .................. | 204/298.11 |
| 2004/0206804 A1 | * | 10/2004 | Kim et al. ..................... | 228/199 |
| 2006/0137970 A1 | * | 6/2006 | Ahn ....................... | C23C 14/564 |
| | | | | 204/192.15 |
| 2012/0318668 A1 | * | 12/2012 | Tsukamoto .............. | 204/298.02 |

* cited by examiner

*Primary Examiner* — Jason M Berman
(74) *Attorney, Agent, or Firm* — McDermott Will & Emery LLP

(57) ABSTRACT

A physical vapor deposition (PVD) chamber, a process kit of a PVD chamber and a method of fabricating a process kit of a PVD chamber are provided. In various embodiments, the PVD chamber includes a sputtering target, a power supply, a process kit, and a substrate support. The sputtering target has a sputtering surface that is in contact with a process region. The power supply is electrically connected to the sputtering target. The process kit has an inner surface at least partially enclosing the process region, and a liner layer disposed on the inner surface. The substrate support has a substrate receiving surface, wherein the liner layer disposed on the inner surface of the process kit has a surface roughness (Rz), and the surface roughness (Rz) is substantially in a range of 50-200 μm.

10 Claims, 5 Drawing Sheets

PROCESS KIT OF PHYSICAL VAPOR DEPOSITION CHAMBER AND FABRICATING METHOD THEREOF

BACKGROUND

Physical vapor deposition (PVD) is one of the most commonly used processes in the fabrication of semiconductor industry. The PVD process is a plasma process performed in a vacuum chamber where a negatively biased sputtering target is exposed to plasma of an inert gas having relatively heavy atoms such as argon (Ar) gas or a gas mixture comprising such inert gas. Bombardment of the sputtering target by ions of the inert gas results in ejection of atoms of the sputtering target material. The ejected atoms accumulate as a deposited film on a substrate placed on a substrate support disposed within the chamber.

In the PVD process, film compositions of the deposited film and controlling of the film composition variation during sequential wafers processing are restricted by the composition of the sputtering target. As known in semiconductor industry, various compositions of layers of metal gates are required to meet various electrical-property requirements such as drain current (Id) and tunneling voltage (Vt) of a transistor, and most layers of metal gates are fabricated by the PVD process.

Drain current (Id) and tunneling voltage (Vt) are key factors of the transistor and are highly correlated to the film composition of metal gates. Controlling of the film compositions of the deposited film and the film composition variation during sequential wafers processing has become serious and important issue in the PVD process. Accordingly, improvements in controlling of the film compositions of the deposited film and the film composition variation during sequential wafers processing for physical vapor deposition continue to be sought.

BRIEF DESCRIPTION OF THE DRAWINGS

Embodiments of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

It is to be understood that the following disclosure provides many different embodiments, or examples, for implementing different features of the invention. Specific examples of components and arrangements are described below to simplify the present disclosure. These are, of course, merely examples and are not intended to be limiting. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for the sake of simplicity and clarity.

The singular forms "a," "an" and "the" used herein include plural referents unless the context clearly dictates otherwise. Therefore, reference to, for example, a liner layer includes embodiments having two or more such liner layers, unless the context clearly indicates otherwise. Reference throughout this specification to "one embodiment" or "an embodiment" means that a particular feature, structure, or characteristic described in connection with the embodiment is included in at least one embodiment of the present disclosure. Therefore, the appearances of the phrases "in one embodiment" or "in an embodiment" in various places throughout this specification are not necessarily all referring to the same embodiment. Further, the particular features, structures, or characteristics may be combined in any suitable manner in one or more embodiments. It should be appreciated that the following figures are not drawn to scale; rather, these figures are intended for illustration.

Conventionally approach for controlling of film compositions of the physical vapor deposited film is adjusting parameters of PVD process such as power, gas flow, and temperature. However, these adjustments have potential risks on film property drifting and/or high cost concerns. In this regard, a PVD chamber, a process kit of a PVD chamber and a method of fabricating a process kit of a PVD chamber are provided according to various embodiments of the present disclosure.

Figure 1:
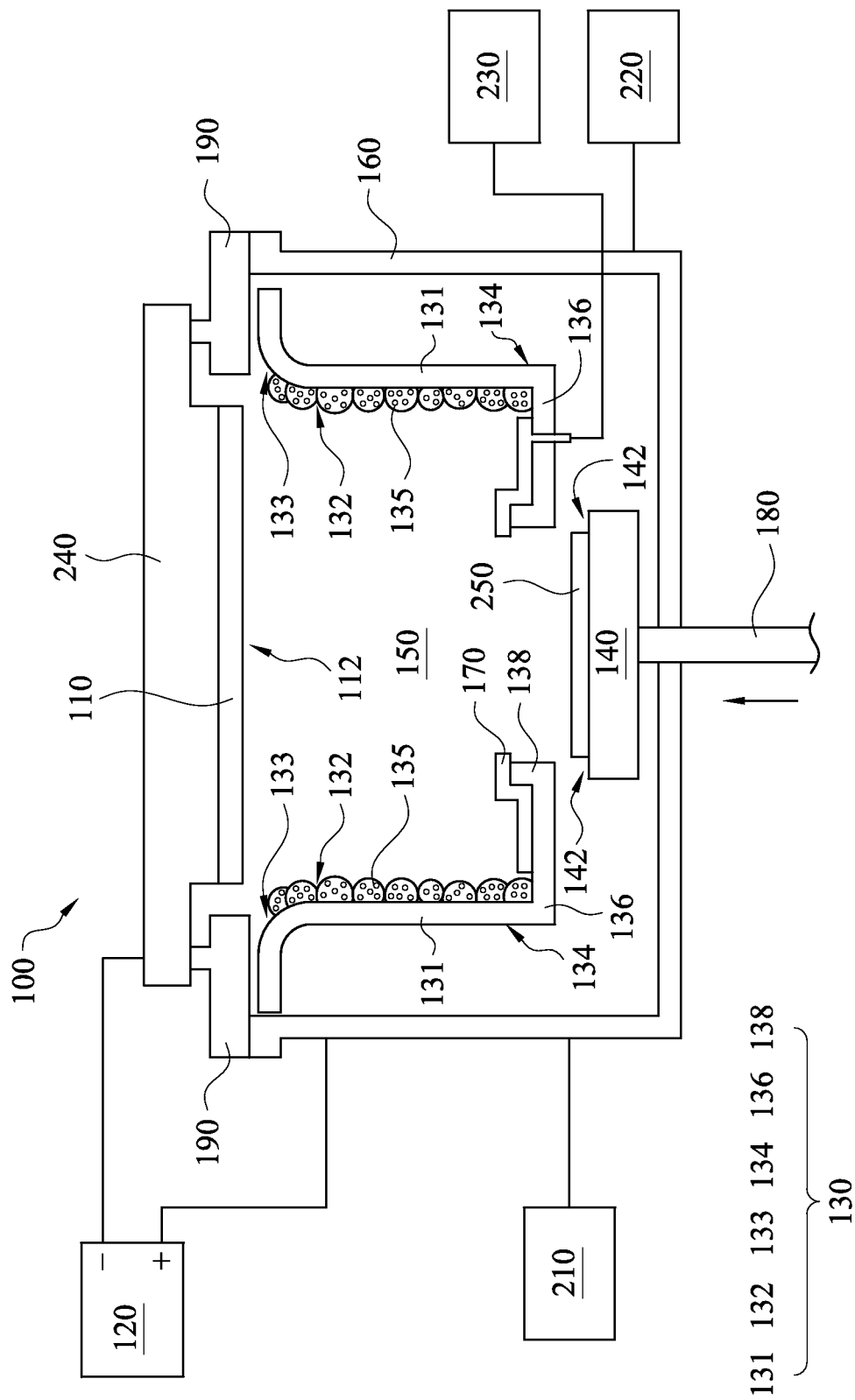
FIG. 1 is a simplified block diagram illustrating a physical vapor deposition (PVD) chamber for a sputtering deposition process according to various embodiments of the present disclosure.

FIG. 1 is a simplified block diagram illustrating a PVD chamber for a sputtering deposition process according to various embodiments of the present disclosure. The PVD chamber 100 includes a sputtering target 110, a power supply 120, a process kit 130, and a substrate support 140. As illustrated in FIG. 1, the sputtering target 110 has a sputtering surface 112 that is in contact with a process region 150. The power supply 120 is electrically connected to the sputtering target 110. In various embodiments of the present disclosure, the power supply 120 is a DC supply. For example, the negative electrode of the power supply 120 may be electrically connected to a source 240, and the source 240 is also electrically connected to the sputtering target 110 as shown in FIG. 1. The sputtering target 110 composed of metal or metal alloys which are predetermined to deposit onto a substrate. In various embodiments of the present disclosure, the sputtering target includes titanium (Ti). In other various embodiments of the present disclosure, the sputtering target includes titanium aluminum alloy (TiAl).

Referring to FIG. 1, the process kit 130 has an inner surface 132 and a liner layer 135. The inner surface 132 at least partially encloses the process region 150. The liner layer 132 is disposed on the inner surface 132. The liner layer 132 may include metal oxides. In various embodiments of the present disclosure, the liner layer 132 includes aluminum oxide ($Al_2O_3$), titanium oxide ($TiO_2$), or a combination thereof. In various embodiments of the present disclosure, the liner layer 132 comprises a plurality of strips. Also as illustrated in FIG. 1, the process kit 130 of the PVD chamber 100 includes a cylindrical outer band 131, a base plate 136, and a cylindrical inner band 138. The cylindrical outer band 131 has a top end 133 and a bottom end 134. The top end 133 is sized to encircle the sputtering surface 112 of the sputtering target 110. The bottom end 134 is sized to surround the substrate support 140. The base plate 136 extends inward from the bottom end 134 of the cylindrical outer band 131. The cylindrical inner band 138 is coupled with the base plate 136 and sized to encircle a peripheral edge 142 of the substrate support 140. The process kit 130 is supported by the chamber body 160 and encircles the sputtering surface 112 of the sputtering target 110 that faces the process region 150 and the substrate support 140. The process kit 130 also surrounds the peripheral edge 142 of the substrate support 140. In other words, an upper portion of the cylindrical outer band 131 surrounds the sputtering surface 112 of the sputtering target 110 and a bottom portion of the cylindrical outer band 131 surrounds the substrate support 140. Also as illustrated in FIG. 1, a U-shaped may be formed by the cylindrical inner band 138, the base plate 136, and the cylindrical outer band 131. In various embodiments of the present disclosure, the cylindrical outer band 131 has a height greater than a height of the cylindrical inner band 138. In other words, the cylindrical inner band 138 has a height that is less than the height of the cylindrical outer band 131. In various embodiments of the present disclosure, the cylindrical outer band, the base plate, and the cylindrical inner band have a unitary structure. For example, the cylindrical outer band, the base plate, and the cylindrical inner band may be made of single piece of metal as the unitary structure. In various embodiments of the present disclosure, the unitary structure comprises aluminum, stainless steel, or a combination thereof. It is advantageous over prior process kits which include multiple components, often two or three separate pieces to make up the complete process kit. A process kit with multiple components makes it more difficult and laborious to remove the shield for cleaning. In addition, the single piece process kit 130 also more effectively shields the chamber body 160 from sputter deposition during process cycles. In general, the process kit 130 is designed to reduce deposition of sputtering deposits originating from the sputtering surface 112 of the sputtering target 110 onto the components and surfaces behind the process kit 130. According to various embodiments of the present disclosure, it should be noticed that the cylindrical outer band 131 has a surface roughness (Rz), and the surface roughness (Rz) is substantially in a range of 50-200 μm. The PVD processes can be affected and controlled by altering the surface roughness (Rz) of the cylindrical outer band 131 since the process region 150 is at least partially enclosed by the cylindrical outer band 131. As illustrated in FIG. 1, in various embodiments of the present disclosure, the cylindrical outer band 131 further includes a liner layer 135 disposed on the inner surface 132 of the cylindrical outer band 131. Therefore, the inner surface 132 has the surface roughness (Rz). The liner layer 135 may include metal oxide. In various embodiments of the present disclosure, the metal oxide includes aluminum oxide ($Al_2O_3$), titanium oxide ($TiO_2$), or a combination thereof.

The substrate support 140 has a substrate receiving surface 142. A substrate 250, for example, a wafer is placed on the substrate receiving surface 142 of the substrate support 140 for PVD processes. During the PVD processes, a substrate 250, for example, a wafer is transferred into the PVD chamber 100 and placed on the substrate receiving surface 142 of the substrate support 140. The substrate support 140 is raised through a covering ring 170 and the process kit 130 to the process region 150. The substrate support 140 is raised, for example, by a raising mechanism 180. A DC substrate bias source 230 provides a DC bias to the substrate 250, for example, through the covering ring 170 and a line 232. A gas flow control 210 controls gas flow in and out of the PVD chamber 100. A vacuum pump 220 is used to create a vacuum environment in the PVD chamber 100 during the PVD processes.

As illustrated in FIG. 1, the source 240 is electrically isolated from the process kit 130 and the rest of PVD chamber 100, such as a chamber body 160, by an isolation part 190. The power supply 120 establishes a voltage potential between the sputtering target 110 and other parts, such as the chamber body 160, of the PVD chamber 100. For example, when the substrates 250 are being processed, the negative terminal of the power supply 120 is electrically connected to the sputtering target 110; the positive terminal of the power supply 120 is electrically connected to other parts of the PVD chamber 100. This operating mode is used because gaseous ions from plasma will be accelerated toward whatever surface is connected to the negative terminal of the power supply 120. Thus ions in deposition plasma strike the sputtering target 110, and cause sputtering of metal or metal alloys, for example, titanium or titanium aluminum alloy from the sputtering target 110 to the substrates 250 on the substrate receiving surface 142 of the substrate support 140.

Figure 2:
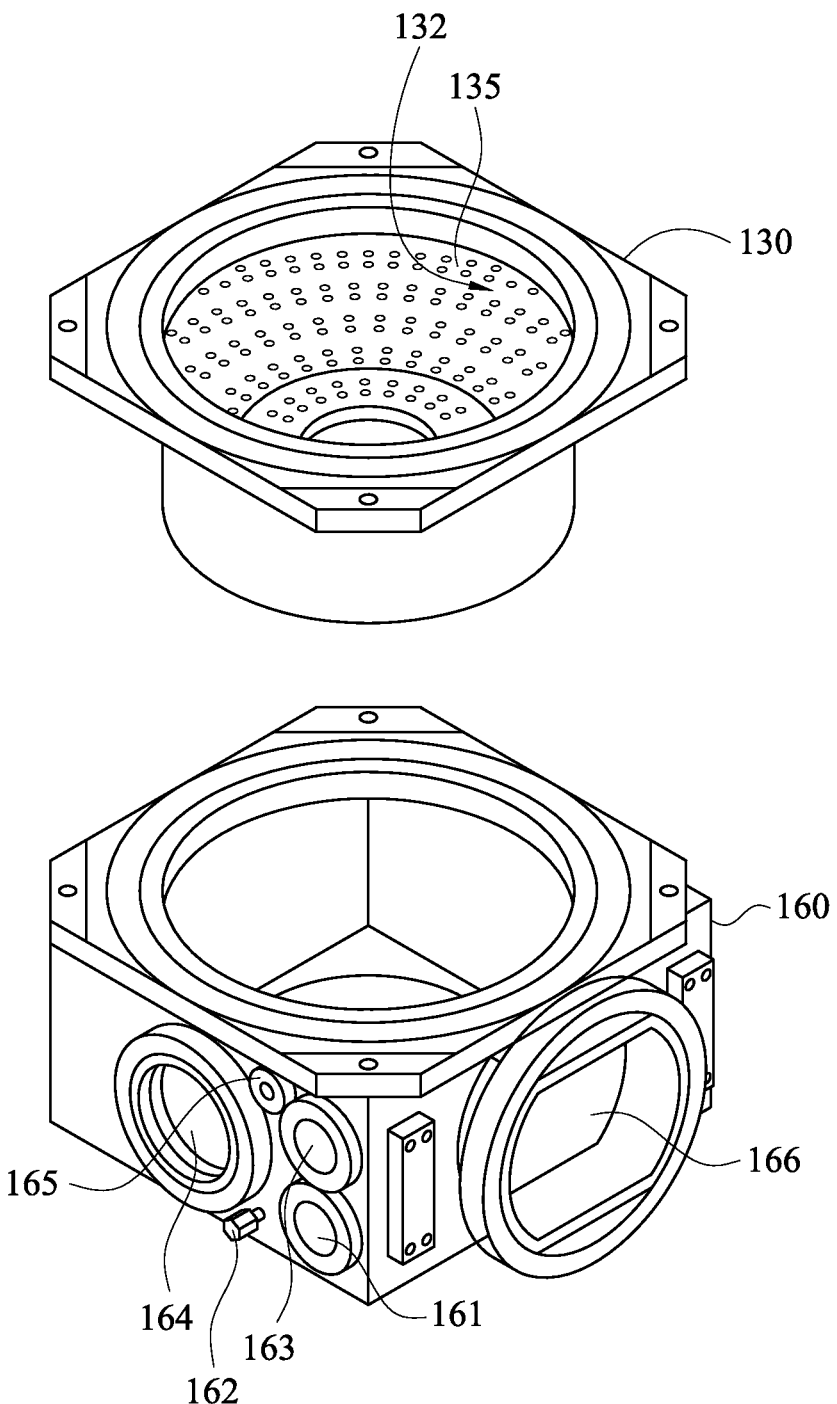
FIG. 2 is a perspective view of a disassembled physical vapor deposition chamber in accordance with various embodiments of the present disclosure.

FIG. 2 illustrates a perspective view of a disassembled PVD chamber in accordance with various embodiments of the present disclosure. As illustrated in FIG. 2, the chamber body 160 may include several ports 161, 162, 163, 164, 165, and an opening 166. The port 161 may be used, for example, by vacuum pump 220 or by a roughing pump for initial pumping to create vacuum environment of the PVD chamber 100 during PVD processes. The port 162 may be, for example, used to allow the power line 232 (as illustrated in FIG. 1) into the chamber body 160 of the PVD chamber 100, for example, to offer the DC bias to the substrate 250 from the DC substrate bias source 230. The port 163 may be, for example, used for venting. The port 164 may be, for example, used as a window for observation during PVD processes. The port 165 may be, for example, used for supplying argon (Ar) gas and any proper reactive gas into the chamber body 160 of the PVD chamber 100 as plasma sources for PVD processes. The substrates 250 are placed into the chamber body 160 of the PVD chamber 100 through the opening 166.

As illustrated in FIG. 1 and FIG. 2, it should be noticed that the liner layer 135 disposed on the inner surface 132 of the process kit 130 has a surface roughness (Rz), and the surface roughness (Rz) is substantially in a range of 50-200 μm. In other words, the process kit 130 of the PVD chamber 100 according to various embodiments of the present disclosure is specially fabricated by forming the liner layer 135 on the inner surface 132 of the process kit 130. The liner layer 135 has the surface roughness (Rz) substantially in a range of 50-200 μm. Therefore, as shown in FIG. 1, the process region 150 is enclosed by a rough sidewall which is the liner layer 135 disposed on the inner surface 132 of the process kit 130. The liner layer 132 may include metal oxides. In various embodiments of the present disclosure, the liner layer 132 includes aluminum oxide ($Al_2O_3$), titanium oxide ($TiO_2$), or a combination thereof. The surface roughness (Rz) of the liner layer 135 on the inner surface 132 of the process kit 130 is sampled from the roughness profile of the liner layer 135 in the direction of the mean line (the average thickness of the liner layer 135 on the inner surface 132), the distance between the top profile peak line and the bottom profile valley line on this sampled portion is measured in the longitudinal magnification direction of roughness profile. The value of the surface roughness (Rz) is generally expressed in micrometer (μm). The roughness average, skewness, or other properties may be determined by a profilometer that passes a needle over the exposed surface and generates a trace of the fluctuations of the height of the asperities on the surface of the liner layer 135, or by a scanning electron microscope that uses an electron beam reflected from the surface of the liner layer 135 to generate an image of the surface.

Figure 3:
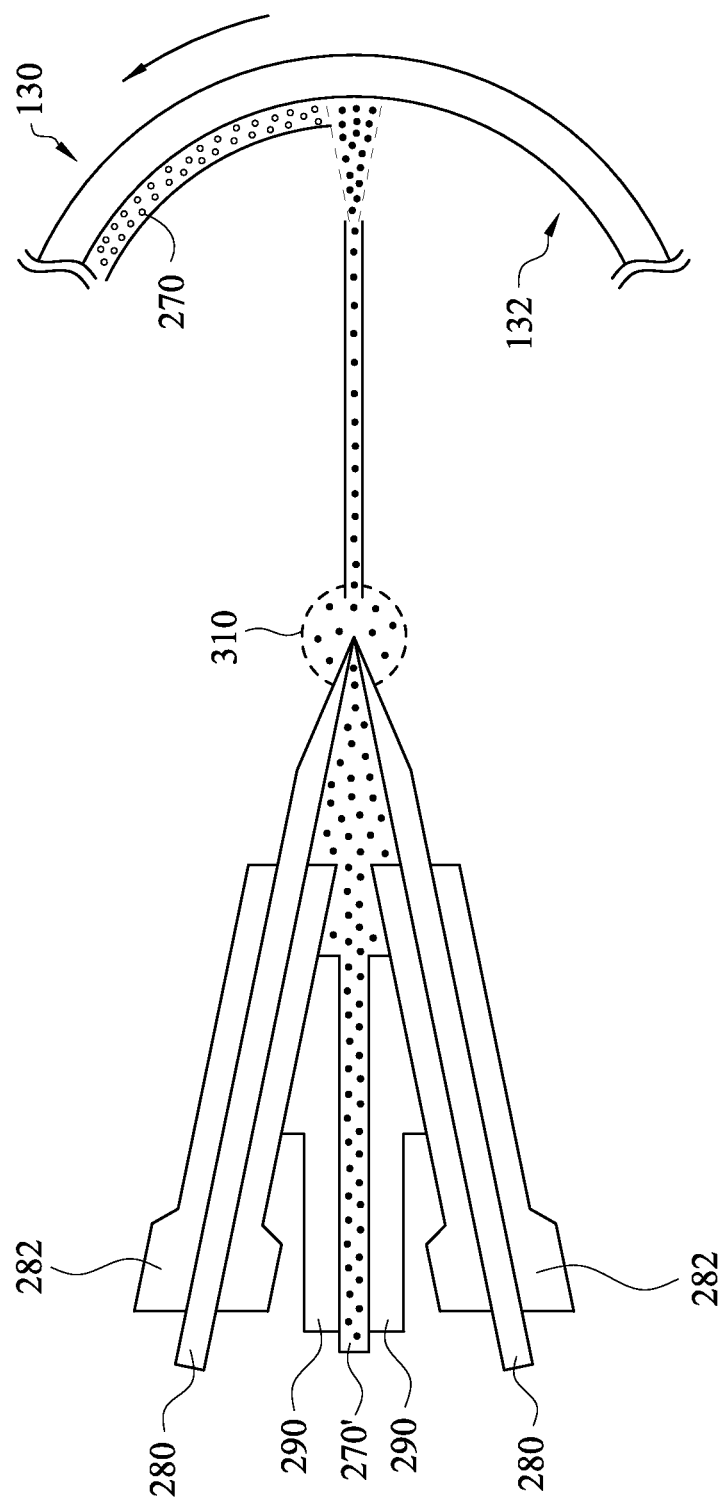
FIG. 3 is a schematic view is a schematic view of a portion of the process kit of the physical vapor deposition chamber in an intermediate stage of manufacturing according to various embodiments of the present disclosure.

FIG. 3 is a schematic view is a schematic view of a portion of the process kit 130 of the PVD chamber 100 in an intermediate stage of manufacturing according to various embodiments of the present disclosure. As illustrated in FIG. 3, the method of fabricating the process kit 130 of the PVD chamber 100 includes providing a shield 130'. The shield 130' has an inner surface 132. The shield 130' can be made from aluminum, stainless steel or a combination thereof. Next, forming a plurality of particles 270 on the inner surface 132 to produce a surface roughness (Rz) on the inner surface 132 of the shield 130'. The surface roughness (Rz) is substantially in a range of 50-200 μm. The particles 270 may be metal oxides particles. As illustrated in FIG. 3, in various embodiments of the present disclosure, forming the plurality of particles 270 on the inner surface 132 further includes arc-spraying metal particles 270' on the inner surface 132 of the shield 130'. The metal particles 270' may be aluminum, titanium, or a combination thereof. The operation of arc-spraying metal particles 270' is illustrated in FIG. 3, two wires 280 respectively positioned in two wire-guides 282 act as electrodes. The wires 280 are respectively electrically connected to positive and negative electrodes of a high-current (DC) power source to facilitate an arc 310 between the wires 280. An atomizing air stream of metal particles 270' is ejected from an arc-spraying gun 290 towards on the inner surface 132 of the shield 130'. With adjustable parameters including voltage and amperage arc temperatures can reach 5000° C., enough to melt any material, at the same time the part surface remains cool. Arc-spraying rates are driven primarily by the operating current and vary as a function of both melting point and conductivity of the atomizing air stream of metal particles 270'. The surface roughness (Rz) formed on the inner surface 132 can be varied and controlled by parameters of arc-spraying, for example, altering the operating current or choosing proper materials of the atomizing air stream of metal particles 270'. After being coated on the inner surface 132, the metal particles 270' are oxidized into metal oxides particles 270 as illustrated in FIG. 3. In various embodiments of the present disclosure, the metal oxides particles include aluminum oxide ($Al_2O_3$), titanium oxide ($TiO_2$), or a combination thereof.

Figure 4:
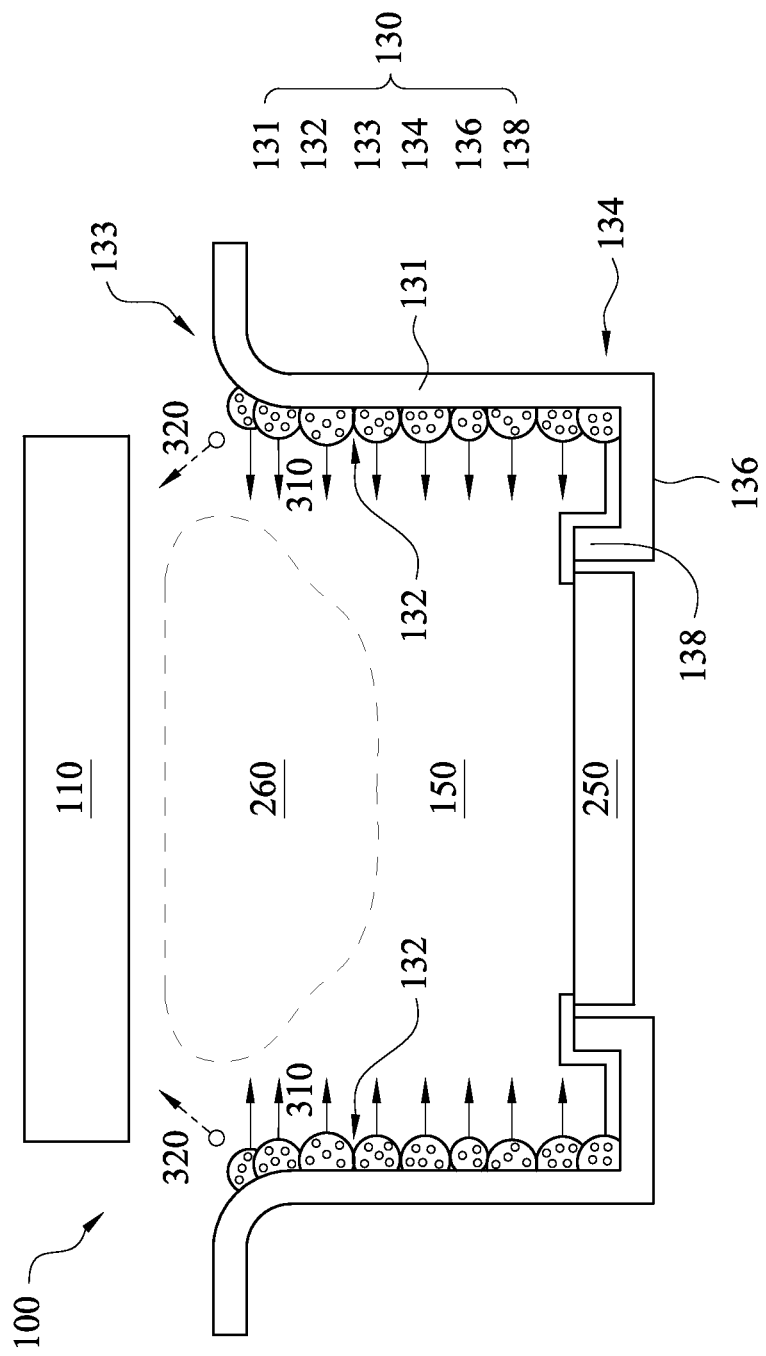
FIG. 4 is a schematic view of a part of the physical vapor deposition chamber 100 during physical vapor deposition processes according to various embodiments of the present disclosure.

FIG. 4 is a schematic view of a part of the PVD chamber 100 during PVD processes according to various embodiments of the present disclosure. As aforementioned, since the process region 150 is at least partially enclosed by the cylindrical outer band 131, the PVD processes can be affected and controlled by altering the surface roughness (Rz) of the cylindrical outer band 131. As illustrated in FIG. 4, inductive currents 310 from the surface roughness (Rz) of the inner surface 132 of the process kit 130 are inducted by an electrical field generated in the PVD chamber 100 during PVD processes. The inductive currents 310 from the surface roughness (Rz) of the inner surface 132 of the process kit 130 impact the shape of the plasma, and therefore affect the film composition and the uniformity of the film deposited on the substrate 250. Therefore, while the sputtering target 110 and the desired film composition/uniformity is varied, different process kits 130 with different surface roughness (Rz) can be accordingly applied. In some various embodiments of the present disclosure, the sputtering target 110 includes titanium (Ti), and the surface roughness (Rz) of the inner surface 132 of the process kit 130 is substantially in a range of 90 μm-120 μm accordingly. In some other various embodiments of the present disclosure, the sputtering target 110 includes titanium aluminum alloy (TiAl), and the surface roughness (Rz) of the inner surface 132 of the process kit 130 is substantially in a range of 150 μm-180 μm accordingly. Specifically, the surface roughness (Rz) of the inner surface 132 of the process kit 130 can be regarded as an effective parameter of PVD processes to control the film composition/uniformity deposited on the substrate 250. Generally, other parameters of PVD processes, for example, power increasing, gas flow and process temperature tuning are also effective parameters of PVD processes to control/improve the film composition/uniformity deposited. However, power increase might damage the films which have deposited on the substrate 250; gas flow and process temperature tuning might also have risks on film property drifting while the desired film composition/uniformity is achieved. The surface roughness (Rz) of the inner surface 132 of the process kit 130, as an effective parameter of PVD processes to control the film composition/uniformity deposited on the substrate 250, does not have aforementioned concerns and risks while increase or decrease the surface roughness (Rz) of the inner surface 132 of the process kit 130 to achieve the desired film composition/uniformity. Besides, another challenge of using a multi-compositional sputtering target, such as titanium aluminum alloy (TiAl), is the changing ratio of component materials in the sputtering target over time. The chemical composition of the target surface, such as the ratio of aluminum and titanium in titanium aluminum alloy (TiAl), changes during sequential PVD process.

Figure 5:
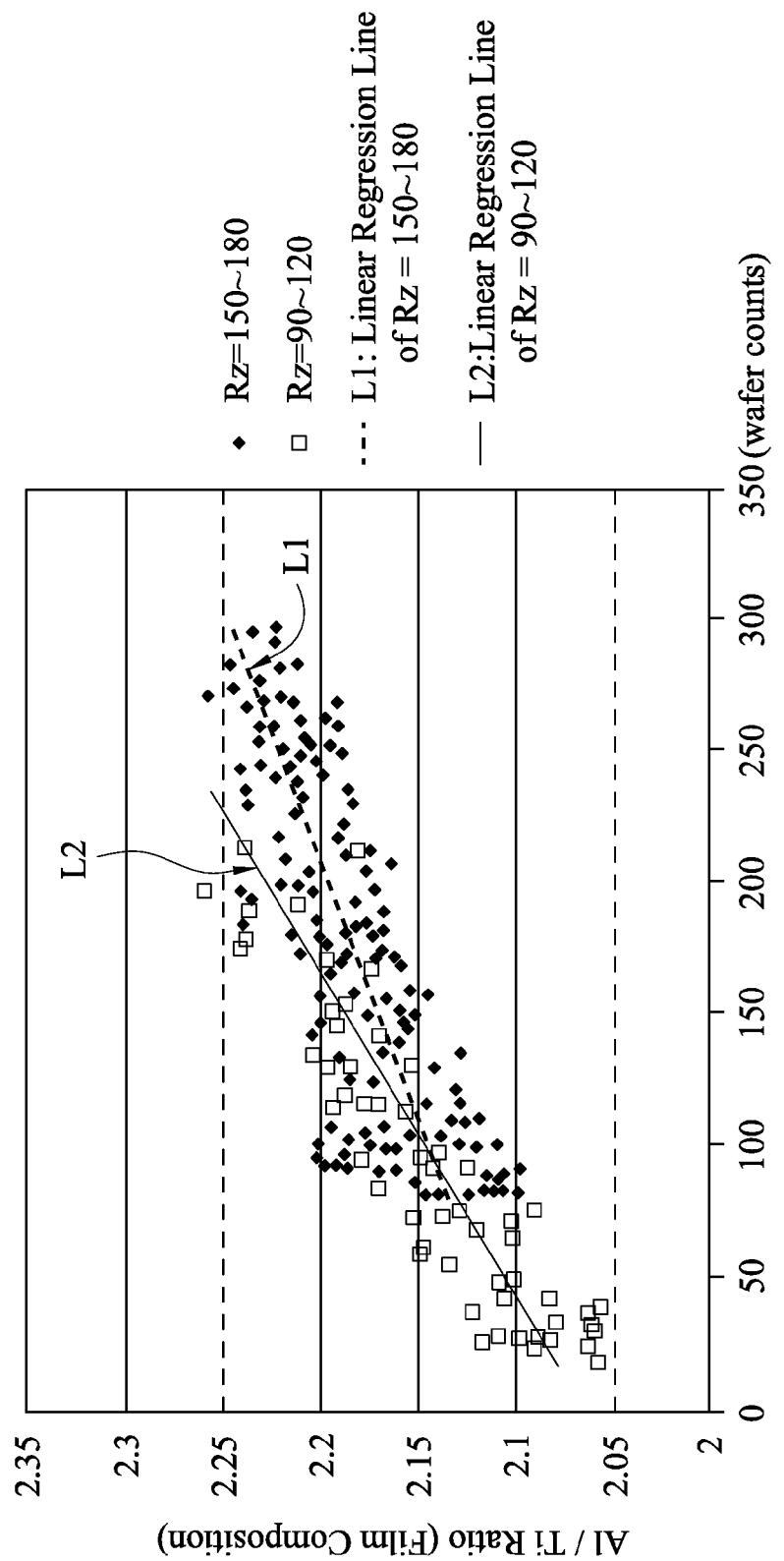
FIG. 5 is a diagram of experiment data of the film composition to lifetime of sputtering target when a multi-compositional sputtering target is applied.

FIG. 5 illustrates a diagram of experiment data of the film composition to lifetime of sputtering target when a multi-compositional sputtering target is applied. The multi-compositional sputtering target includes aluminum (Al) and titanium (Ti), and the molar ratio of aluminum (Al) and titanium (Ti) is 1:1. Referring to FIG. 5, two series of sequential PVD processes are performed. The data collected of one series of sequential PVD process utilizing the process kit with surface roughness (Rz) 150-180 μm is labeled as "♦" in FIG. 5; and the data collected of the other series of sequential PVD process utilizing the process kit with surface roughness (Rz) 90-120 μm is labeled as "□" in FIG. 5. Except the process kits with different surface roughness (Rz) are respectively utilized in these two series of sequential PVD processes, other parameters of PVD process are substantially the same. L1 is a linear regression line of sequential PVD process utilizing the process kit with surface roughness (Rz) 150-180 μm (labeled as "♦"); and L2 is a linear regression line of sequential PVD process utilizing the other process kit with surface roughness (Rz) 90-120 μm (labeled as "□"). As shown in FIG. 5, the Al/Ti ratio increases during sequential PVD process in both series of sequential PVD processes. However, the slopes of both series are different. The slope of L1 is less than that of L2. Therefore, the Al/Ti ratio increase of L1 is not as rapid as that of L2. Accordingly, the life time of sputtering target of sequential PVD process utilizing the process kit with surface roughness (Rz) 150-180 μm (labeled as "♦") can be greater than greater than that of sequential PVD process utilizing the process kit with surface roughness (Rz) 90-120 μm (labeled as "☐") when the range of the desired film composition is narrower, for example, 2.1-2.25. On the other hand, the starting Al/Ti ratios of these two sequential PVD processes are also different. As shown in FIG. 5, the Al/Ti ratio of sequential PVD process utilizing the process kit with surface roughness (Rz) 150-180 μm (labeled as "♦") starts from approximately 2.1, and that of sequential PVD process utilizing the process kit with surface roughness (Rz) 90-120 μm (labeled as "☐") starts from approximately 2.05. Therefore, the process kit with different surface roughnesses (Rz) can be selected by which of the Al/Ti ratios is desired. Accordingly, PVD processes corresponding to various desired film compositions can be perform by utilizing different the process kit with various surface roughness (Rz), so as to retain more flexibility on PVD processes without modifying other parameters which have potential risks to generate unexpected side effects as aforementioned.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A physical vapor deposition (PVD) chamber, comprising:
   a sputtering target having a sputtering surface that is in contact with a process region, the sputtering target comprising Ti;
   a power supply electrically connected to the sputtering target;
   a process kit having an inner surface at least partially enclosing the process region, and a metal oxide current inducing layer disposed on the inner surface, wherein the metal oxide current inducing layer comprises aluminum oxide ($Al_2O_3$), titanium oxide ($TiO_2$), or a combination thereof, and has a surface roughness (Rz) substantially ranged from 90 μm to 120 μm configured to induce an inductive current from the inner surface of the process kit to the process region; and
   a substrate support having a substrate receiving surface.

2. The PVD chamber of claim 1, wherein the power supply is a DC supply.

3. The PVD chamber of claim 1, wherein the metal oxide current inducing layer comprises a plurality of strips.

4. A physical vapor deposition (PVD) chamber, comprising:
   a sputtering target comprising titanium aluminum alloy (TiAl) in contact with a process region;
   a cylindrical outer band having a top end sized to encircle a sputtering surface of the sputtering target and a bottom end sized to surround a substrate support;
   a base plate extending inward from the bottom end of the cylindrical outer band; and
   a cylindrical inner band coupled with the base plate and sized to encircle a peripheral edge of the substrate support,
   wherein the cylindrical outer band has a metal oxide current inducing layer disposed on an inner surface of the cylindrical outer band, wherein the metal oxide current inducing layer has a surface roughness (Rz) substantially in a range of 150-180 μm configured to induce an inductive current from the inner surface to the process region in contact with the titanium aluminum alloy.

5. The PVD chamber of claim 4, wherein the metal oxide comprises aluminum oxide ($Al_2O_3$), titanium oxide ($TiO_2$), or a combination thereof.

6. The PVD chamber of claim 4, wherein the cylindrical outer band, the base plate, and the cylindrical inner band comprise a unitary structure.

7. The PVD chamber of claim 6, wherein the unitary structure comprises aluminum, stainless steel, or a combination thereof.

8. The PVD chamber of claim 4, wherein the cylindrical outer band has a height greater than a height of the cylindrical inner band.

9. A method of fabricating a process kit of a PVD chamber, comprising:
   providing a shield having a surface;
   providing metal particles into an arc-spraying apparatus, wherein the metal particles comprise aluminum, titanium, or a combination thereof;
   applying the arc-spraying apparatus to spray the metal particles on the surface of the shield, and controlling a voltage of the arc-spraying apparatus to control a surface roughness of the sprayed metal particles on the surface; and
   oxidizing the sprayed metal particles into a plurality of metal oxide particles to produce a surface roughness (Rz) on the surface of the shield, and the surface roughness (Rz) is substantially in a range of 90-120 μm.

10. The method of claim 9, wherein the metal oxide particles comprise aluminum oxide ($Al_2O_3$), titanium oxide ($TiO_2$), or a combination thereof.

* * * * *